(12) United States Patent
Freundt et al.

(10) Patent No.: US 10,580,595 B2
(45) Date of Patent: Mar. 3, 2020

(54) ELECTRICAL SWITCHING DEVICE HAVING PARALLEL SWITCHING PATHS

(71) Applicant: Siemens Aktiengesellschaft, Munich (DE)

(72) Inventors: Karsten Freundt, Falkensee (DE); Hartmut Kaletta, Berlin (DE); Andreas Malitz, Glienicke (DE); Ulf Schuemann, Dallgow-Doeberitz (DE); Erik D. Taylor, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 296 days.

(21) Appl. No.: 15/325,219

(22) PCT Filed: Jul. 16, 2015

(86) PCT No.: PCT/EP2015/066282
§ 371 (c)(1),
(2) Date: Jan. 10, 2017

(87) PCT Pub. No.: WO2016/020166
PCT Pub. Date: Feb. 11, 2016

(65) Prior Publication Data
US 2017/0162344 A1 Jun. 8, 2017

(30) Foreign Application Priority Data

Aug. 5, 2014 (DE) .................. 10 2014 215 446

(51) Int. Cl.
*H01H 9/56* (2006.01)
*H03K 17/13* (2006.01)
(Continued)

(52) U.S. Cl.
CPC .............. *H01H 9/56* (2013.01); *H01H 9/563* (2013.01); *H03K 5/153* (2013.01); *H03K 17/13* (2013.01); *H01H 9/40* (2013.01); *H01H 33/66* (2013.01)

(58) Field of Classification Search
CPC ............ H01H 9/56; H01H 9/563; H01H 9/40; H01H 33/66; H03K 17/13; H03K 5/153
See application file for complete search history.

(56) References Cited

U.S. PATENT DOCUMENTS

| 4,356,525 | A | | 10/1982 | Kornrumpf et al. |
| 5,963,021 | A | * | 10/1999 | Rostron ................. H01H 9/563 323/210 |
| 6,956,728 | B2 | * | 10/2005 | Zhou ..................... H01H 9/563 361/160 |

FOREIGN PATENT DOCUMENTS

| DE | 3151839 A1 | 8/1982 |
| DE | 19525286 A1 | 1/1997 |

(Continued)

OTHER PUBLICATIONS

International Search Report and Written Opinion dated Sep. 24, 2015.
German Office Action dated Jun. 12, 2015.

*Primary Examiner* — Daniel J Cavallari
(74) *Attorney, Agent, or Firm* — Harness, Dickey & Pierce, P.L.C.

(57) ABSTRACT

A method for operating an electrical switching device and an electrical switching device are disclosed. In order to ensure reliable operation of an electrical switching device having parallel switching paths allocated to a phase, which have lower switching capacity in comparison to conventional parallel switching paths, the zero current crossings in the phase are detected and at least one switching mechanism, operatively connected to the switching paths, is actuated so (Continued)

that all parallel switching paths allocated to the phase open within a window of time which is in the phase relative to the zero current crossings.

23 Claims, 2 Drawing Sheets

(51) Int. Cl.
    *H03K 5/153*     (2006.01)
    *H01H 9/40*     (2006.01)
    *H01H 33/66*     (2006.01)

(56) References Cited

FOREIGN PATENT DOCUMENTS

| | | |
|---|---|---|
| DE | 19809828 C1 | 7/1999 |
| DE | 602004003403 T2 | 10/2007 |
| EP | 1536442 A1 | 6/2005 |
| WO | WO 9003656 A1 | 4/1990 |

\* cited by examiner

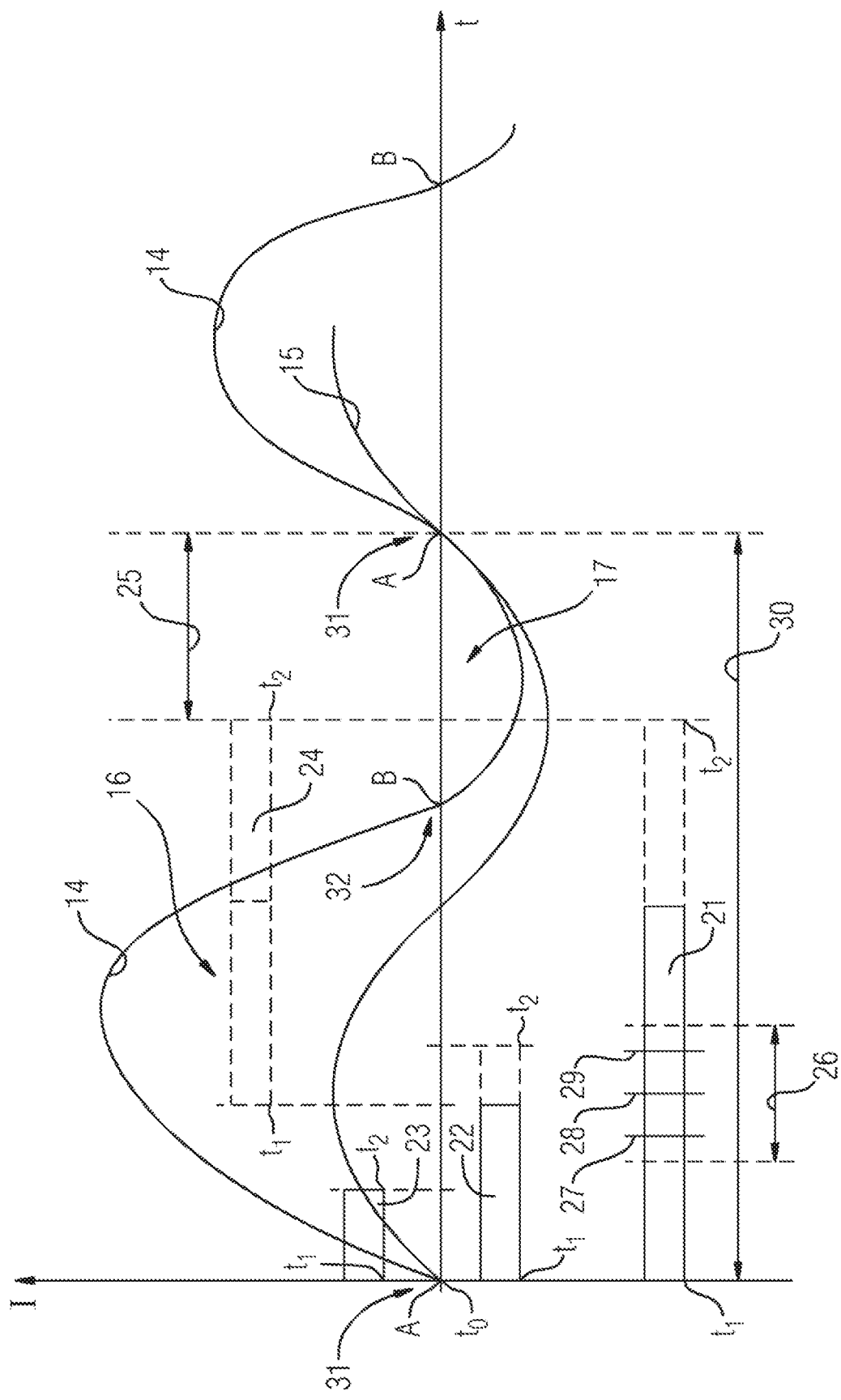

ELECTRICAL SWITCHING DEVICE HAVING PARALLEL SWITCHING PATHS

PRIORITY STATEMENT

This application is the national phase under 35 U.S.C. § 371 of PCT International Application No. PCT/EP2015/066282 which has an International filing date of Jul. 16, 2015, which designated the United States of America and which claims priority to German patent application number DE 102014215446.4 filed Aug. 5, 2014, the entire contents of which are hereby incorporated herein by reference.

FIELD

An embodiment of the invention generally relates to a method for operating an electrical switching device. An embodiment of the invention further generally relates to such an electrical switching device.

BACKGROUND

Electrical switching devices in which at least two parallel switching paths are allocated to a phase are known from the prior art. Carrying high rated currents in electrical switching devices requires low-resistance switching paths in order to satisfy temperature requirements, in particular to limit the heating of switching device components. The use of parallel switching paths can here reduce the total electrical resistance of the switching path arrangement.

If, however, one of the parallel switching paths is opened shortly before a current zero crossing, in particular a current zero crossing prior to a large half wave, a further flow of current occurs in this switching path as a result of an attempt to extinguish. If this switching path does not possess the necessary extinguishing capacity to switch off the current at the subsequent current zero crossing, failure to extinguish results. Each individual parallel switching path must therefore have a sufficiently large extinguishing capacity to handle such a situation.

SUMMARY

An embodiment of the present invention includes ensuring a reliable operation of an electrical switching device with parallel switching paths which, in comparison with conventional parallel switching paths, exhibit lower switching power capacities.

An embodiment of the present invention is directed to a method and/or a switching device. Advantageous embodiments of the invention are disclosed in the claims.

The advantages and embodiments explained below in the context of the methods also apply analogously to the switching device according to embodiments of the invention, and vice versa.

The method according to an embodiment of the invention serves for the operation of an electrical switching device, in which switching device at least two parallel switching paths are allocated to a phase, and comprises: detection of current zero crossings in this phase, and actuation of at least one switching mechanism, which is operatively connected to the switching paths, in such a way that all parallel switching paths allocated to this phase open within a window of time that is correlated to the current zero crossings in this phase.

The electrical switching device according to an embodiment of the invention comprises at least two parallel switching paths allocated to a phase, means for the detection of current zero crossings in this phase, and means for the actuation of at least one switching mechanism, which is operatively connected to the switching paths, in such a way that all parallel switching paths allocated to this phase open within a window of time that is correlated to the current zero crossings in this phase.

The electrical switching device according to an embodiment of the invention comprises at least two parallel switching paths allocated to a phase, a detector to detect current zero crossings in this phase, and an actuator to actuate at least one switching mechanism, which is operatively connected to the switching paths, in such a way that all parallel switching paths allocated to this phase open within a window of time that is correlated to the current zero crossings in this phase.

BRIEF DESCRIPTION OF THE DRAWINGS

The properties, features and advantages of this invention, described above, as well as the manner in which this is achieved, will be understood with greater clarity and meaning in connection with the following description of the example embodiments, which are explained in more detail in association with the drawings. Here:

FIG. 3 shows the current I of a phase, plotted against the time t, for a switch-off process.

Figure 1:
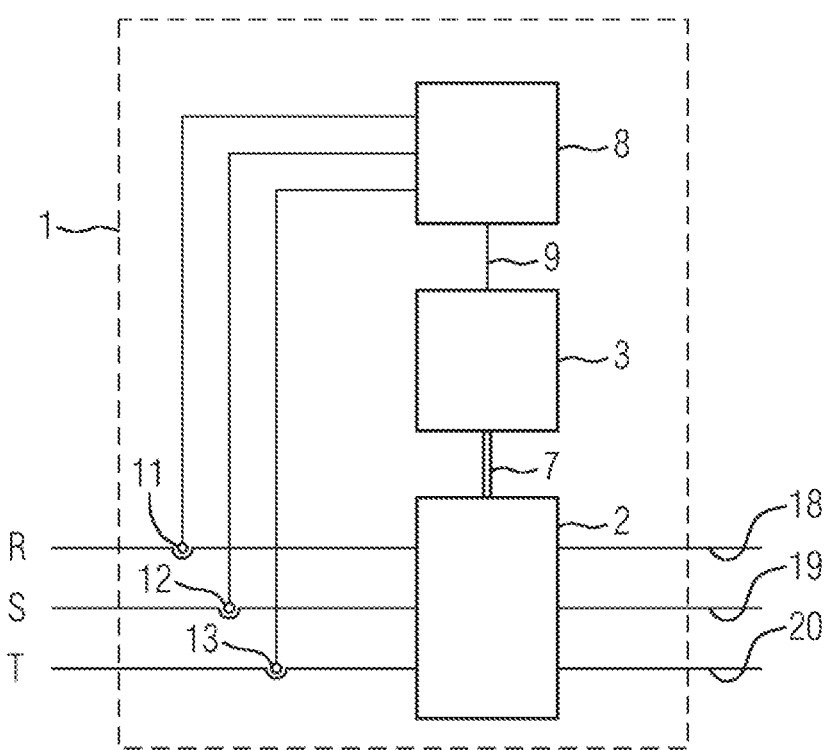
FIG. 1 shows a greatly simplified circuit diagram of a switching device according to an embodiment of the invention in a three-phase network.

All of the figures only show embodiments of the invention schematically, and with its principal components. The same reference signs here correspond to elements with the same or comparable function.

DETAILED DESCRIPTION OF THE EXAMPLE EMBODIMENTS

The advantages and embodiments explained below in the context of the methods also apply analogously to the switching device according to embodiments of the invention, and vice versa.

The terms switching power capacity, switching power and switching capacity are used synonymously below.

The method according to an embodiment of the invention serves for the operation of an electrical switching device, in which switching device at least two parallel switching paths are allocated to a phase, and comprises: detection of current zero crossings in this phase, and actuation of at least one switching mechanism, which is operatively connected to the switching paths, in such a way that all parallel switching paths allocated to this phase open within a window of time that is correlated to the current zero crossings in this phase.

The electrical switching device according to an embodiment of the invention comprises at least two parallel switching paths allocated to a phase, means for the detection of current zero crossings in this phase, and means for the actuation of at least one switching mechanism, which is operatively connected to the switching paths, in such a way that all parallel switching paths allocated to this phase open within a window of time that is correlated to the current zero crossings in this phase.

An idea of at least one embodiment of the invention is that of employing switching paths, allocated to a phase, of a switching device in parallel operation in such a way that they open within a defined opening window, wherein this opening window is correlated to the current zero crossings in this phase. An opening window refers here to a window of time in which the switching pieces of a switching path actually open.

Through the defined allocation of the opening window to the current zero crossings, it is possible to achieve in a simple manner that each individual one of these parallel switching paths only has to have a switching capacity that is less than the switching capacity that this switching path would have to have if it alone had to extinguish the current to be switched.

A plurality of parallel switching paths are allocated to a phase according to at least one embodiment of the invention. In contrast to an uncontrolled opening, as in the prior art, a synchronized opening of the parallel switching paths within a defined opening window is proposed. In other words, the disconnection time moments of the switching pieces of all the parallel switching paths of one phase are positioned within a defined opening window. Through an appropriate selection of this opening window, it is ensured that all the parallel switching paths open after a current zero crossing and with a sufficient distance in time from the next current zero crossing. The switching paths thus "share" the current that is to be switched, and pass through the next current zero crossing together. This ensures that one single switching path does not have to carry the entire current. Depending on how many parallel switching paths are provided in one phase, each individual one of these switching paths instead only has to handle a fraction of the current. The total loading of each individual one of the parallel switching paths of the switching device, in particular the loading of the switching pieces, is significantly less than in the prior art. With the present invention therefore a reliable operation of an electrical switching device with parallel switching paths which, in comparison with conventional parallel switching paths, have lower switching power capacities, is ensured.

Since the switching paths used exhibit a reduced switching power, the manufacturing costs of a switching device with such parallel switching paths designed to switch a particular current are reduced in comparison with the manufacturing costs of a switching device manufactured according to known systems for switching the same currents. Alternatively, a switching device that uses parallel switching paths with unchanged switching capacity can be used to create higher total switch-off powers through the use of the method according to at least one embodiment of the invention.

In the case of a switching device for a multi-phase network, then the at least two parallel switching paths that are actuated in the manner according to at least one embodiment of the invention are allocated to at least one of the phases. Preferably, however, all the phases of the multi-phase network comprise the at least two parallel switching paths, which are then actuated according to at least one embodiment of the invention.

Embodiments of the invention are not restricted to one particular kind of electrical switching device. Embodiments of the invention are, however, particularly advantageously applicable to switching devices that are suitable for high currents, in particular for generator switches such as, for example, a vacuum generator switch for operating currents up to 6300 A and short-circuit switch-off currents up to 72 kA.

A three-phase electrical switching device 1 for medium or high voltage, for example a generator switch, is shown. A short-circuit event is considered by way of example. The switching device 1 is designed for switching or interrupting currents whose phases are offset in time. For this purpose, it has switchable contact systems 2 for each of the three phases 18, 19, 20 (R, S, T) of an energy transmission line. Three parallel interruption units are here allocated to at least one of these phases 18, 19, 20, preferably however to all the phases 18, 19, 20. The interruption units are, for example, vacuum interrupters. These have the property that their switching paths 4, 5, 6 return to their dielectric strength again very quickly when switching off.

An actuation apparatus 3 of the switching device 1 is designed for the simultaneous actuation of all the contact systems 2 allocated to one phase 18, 19, 20. Put another way, a single actuation apparatus 3 serves for the simultaneous opening of all the parallel switching paths 4, 5, 6 of one phase 18, 19, 20. For this purpose, the at least one switching mechanism of the actuation apparatus 3 is operatively connected to the switching paths 4, 5, 6, or, more precisely, with the switching pieces of these switching paths 4, 5, 6, through a common actuation shaft 7; see FIG. 2.

The switching mechanism of the actuation apparatus 3 is actuated by an electrical triggering control device 8 which is connected to the actuation apparatus 3 via a control line 9. Expressed otherwise, the switching device 1 comprises a control apparatus in the form of a triggering control device 8 for generating a trigger signal for the actuation apparatus 3 following the occurrence of a short-circuit. Following such a trigger signal, a switch-off command is sent to the actuation apparatus 3 for opening the parallel switching paths 4, 5, 6. Through this, an opening movement of the switching pieces of one of the parallel switching paths 4, 5, 6 is initiated. A delay between the switch-off command and the actual opening of the switching pieces results from the inherent operating time of the switch, which results from the mechanical properties of the switching device 1 and of the contact system 2, as well as the transmission times for transmitting the commands from the triggering control device 8 to the actuation apparatus 3.

An electrical magnitude is supplied to the triggering control device 8 through at least one of the current transducers 11, 12, 13 allocated to the respective phase 18, 19, 20, said magnitude being proportional to the current I flowing in the phase 18, 19, 20, and with which the current zero crossings 31, 32 in this phase 18, 19, 20 are detected. In other words, the triggering control device 8 detects and processes the measured values from the current transducers 11, 12, 13, and thus also the current zero crossings 31, 32 of the short-circuit current in the respective phase 18, 19, 20. Instead of the current I, or in addition to this current magnitude, the electrical voltage of the phases 18, 19, 20 can also be detected with the aid of appropriate measuring transducers, and used as input magnitudes for the triggering control device 8.

When a plurality of parallel switching paths 4, 5, 6 are used for one phase 18, 19, 20, it can happen, even if a simultaneous opening of these switching paths 4, 5, 6 is intended, that one of the switching paths 4, 5, 6 opens before a current zero crossing 31, 32, and another of the switching paths 4, 5, 6 opens after a current zero crossing 31, 32. A precisely simultaneous opening, either before or after one current zero crossing 31, 32, is almost impossible to achieve. Those switching paths 4, 5, 6 in which, following an opening process, current is still flowing, must thus be capable of extinguishing the current at the next current zero crossing 31, 32. The switching paths used in the prior art must therefore have comparatively large dimensions.

Against this background, the invention proposes that the opening of the parallel switching paths 4, 5, 6 always takes place between two current zero crossings 31, 32. It is, in particular, to be ensured that all the parallel switching paths 4, 5, 6 of a phase 18, 19, 20 are opened prior to the next current zero crossing 31, 32. A controlled actuation of the parallel switching paths 4, 5, 6 is made for this purpose following a current zero crossing 31, 32. It is knowingly accepted that a complete half wave flows through the overall arrangement of the parallel switching paths 4, 5, 6 of a phase 18, 19, 20. However, as a result of the parallelism of the switching paths 4, 5, 6, this current is divided between the plurality of the switching paths 4, 5, 6 that are present, so that the total loading for each individual one of these parallel switching paths 4, 5, 6 is significantly lower, and thereby markedly better handled, than when a single switching path 4, 5, 6 must carry the next half wave entirely alone. When vacuum interrupters are used, the loading of the switching pieces inside the vacuum switching chambers is, in particular, reduced.

It should be noted here that an asymmetrical current 14 is involved in switching processes or short-circuits, and this, due to the inductances present in the system, contains a direct current component, and only decays bit by bit. After the direct current component in the short-circuit current has decayed, the symmetrical current curve 15 shown in FIG. 3 results. If the current 14 is asymmetrical, then a large half wave 16 alternates with a small half wave 17. For the sake of greater clarity, current zero crossings that are followed by a large half wave 16 are marked with "A" in FIG. 3, while current zero crossings after which a small half wave 17 follows, are marked with "B".

An embodiment of the invention further proposes that whichever parallel switching path 4, 5, 6 opens first, opens as soon as possible after a current zero crossing 31 of type "A". The other switching paths 4, 5, 6 with their synchronization errors open immediately afterwards. It is, as a result, ensured that all the parallel switching paths 4, 5, 6 are opened after a current zero crossing 31 of type "A".

An embodiment of the invention further proposes that the opening window prior to the next current zero crossing 31, 32 ends in particular before the next current zero crossing 32 of type "B". Put more precisely, the opening window should end at a time that is sufficiently far from the next current zero crossing 31, 32 that it is ensured that the dielectric rise of the switching paths 4, 5, 6 is adequate for the required extinguishing performance. In other words, all the parallel switching paths 4, 5, 6 pass together through the next current zero crossing 31, 32, which is sufficiently far away in time that the switching paths 4, 5, 6 have the dielectric rise required for extinguishing the current. The switching paths 4, 5, 6 then extinguish the current reliably.

Even when, as the result of for example a corresponding position of the opening window and/or of an increased synchronization error of the subsequently opening switching paths 4, 5, 6, not all the parallel switching paths 4, 5, 6 are opened at a current zero crossing 32 of type "B", and the symmetrical current at most has to be carried by these switching paths 4, 5, 6. If, in contrast, it is possible, as a result of a suitable selection of the opening window, to ensure that all the parallel switching paths 4, 5, 6 extinguish simultaneously at a current zero crossing 32 of type "B", then these switching paths 4, 5, 6 can even be designed such that they have to manage less current than for the case of symmetrical switching off.

According to an embodiment of the invention, the opening window is thus in close relation to the current zero crossings in this phase. It is therefore an advantage of the invention that the total loading of the parallel switching paths 4, 5, 6 is, as a result of the division of the current, sufficiently small that the switching paths 4, 5, 6 extinguish this current without difficulty and can withstand the voltage. Expressed otherwise, it is possible to achieve with the invention that the first extinguishing switching path 4, 5, 6 achieves the necessary electric strength, and that re-ignition is avoided.

Figure 2:
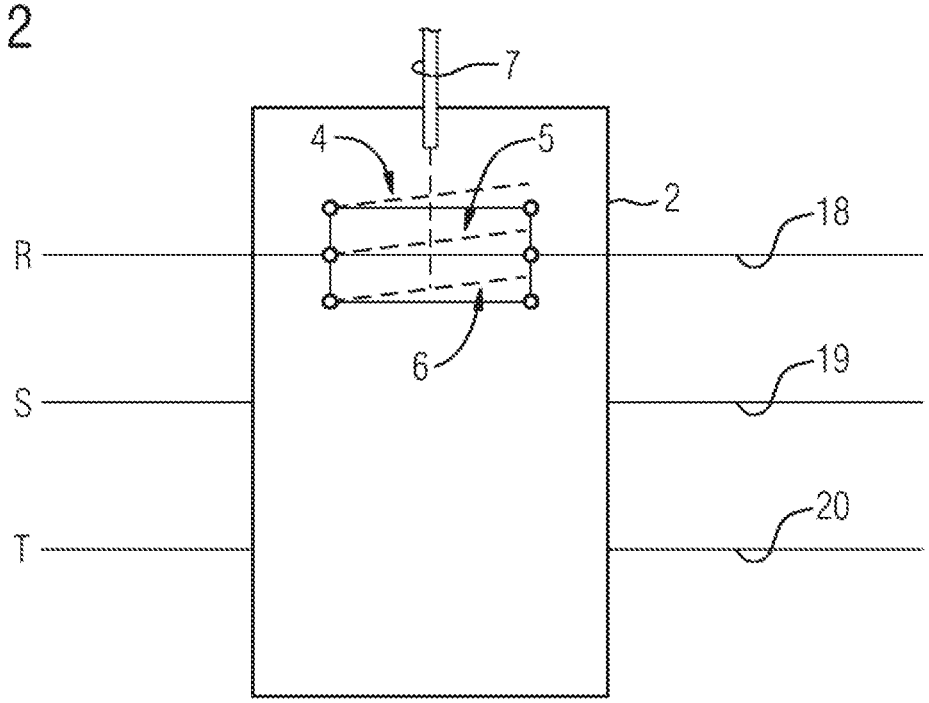
FIG. 2 shows a detail of the switching device with a plurality of parallel interruption units that are allocated to one phase of the network.

If, for example, three parallel switching paths 4, 5, 6 are provided in a phase 18, as is shown in FIG. 2, then these are actuated in such a way that current is flowing through all of them within a defined opening window following a current zero crossing 31 of type "A", wherein each of the switching paths 4, 5, 6 only has to carry one third of a large half wave 16. All the parallel switching paths 4, 5, 6 of a phase 18 pass together through the next, subsequent current zero crossing 32 of type "B", and extinguish the current. In other words, with the invention, the extinguishing of the current in a phase 18 is divided over a plurality of parallel switching paths 4, 5, 6. If, for example, a current of 150 kA is to be switched off, and three parallel switching paths 4, 5, 6 are provided in a phase, then each of these parallel switching paths 4, 5, 6 only has to handle 50 kA. Formulated generally, only an n-th fraction of the current flows in n parallel switching paths 4, 5, 6.

In other words, if it can be ensured that at a current zero crossing of type "B" the current is reliably extinguished, then the level at which the extinguishing capacity of the individual parallel switching paths 4, 5, 6 has to be dimensioned can be derived from this. If, for example, three or five parallel switching paths 4, 5, 6 are opened in the defined opening window, then in the simplest case each of these switching paths 4, 5, 6 only has to handle one third or one fifth of a large half wave 16.

Possible opening windows are described in more detail below. In this connection it should be pointed out that these windows of time describe the respective region in which the parallel switching paths 4, 5, 6 actually open; that is to say, that a synchronized opening of the switching pieces is involved. The actuation of the at least one switching mechanism of the actuation apparatus 3 occurs, according to the inherent operating time of the switching device 1, at a correspondingly earlier point in time.

The start and end of the opening window are determined by the moments in time t1 and t2. At a network frequency of 50 Hertz (period T=20 ms), the moments in time explained below have been found particularly advantageous, calculated in each case from the moment in time (t0) of a current zero crossing of type "A".

What is important, is that the opening window starts after a current zero crossing in the corresponding phase 18, in particular after a current zero crossing 31 of type "A". Preferably, the opening window here starts directly after this current zero crossing 31. In these cases, the start of the opening window 21, 22, 23 begins immediately after a current zero crossing 31 of type "A" (t1=0 ms). The end of the opening window 21, 22, 23 preferably lies a few milliseconds after this current zero crossing 31. In an advantageous form of embodiment of the invention, t2=10 ms to 15 ms. The opening window 21 is thus altogether between 10 and 15 ms long. Even more advantageous is a form of embodiment in which t2=5 to 6 ms, the opening window 22 thus altogether being just 5 to 6 milliseconds long. Even more advantageous is a form of embodiment in which t2=3 ms, the opening window 23 thus altogether being just 3 milliseconds long. Expressed differently, t1 is positioned in these cases 20 ms before the next, subsequent current zero crossing 31 of type "A", while t2, depending on the form of embodiment, is positioned only 5 to 10 ms, or 14 to 15 ms, or even 17 ms before the next current zero crossing 31 of type "A". Particularly advantageous here are those opening windows 22, 23 that are sufficiently short that they end before the next current zero crossing 31 of the same polarity, that is, here, before the next current zero crossing 31 of type "A".

Alternatively, the opening window begins between 5 and 10 milliseconds after a current zero crossing 31 of type "A" (t1=5 ms to 10 ms), and ends comparatively late (t2=10 ms to 15 ms). The opening window 24 is then between 5 ms and 15 ms long. In this case, t1 is thus located 10 to 15 milliseconds before the next current zero crossing 31 of type "A", and t2 is located 5 to 10 milliseconds before the next current zero crossing 31 of type "A".

In such forms of embodiment, in which the opening window 21 is chosen to be larger (e.g. 10 ms to 15 ms), and in such forms of embodiment where the opening window 24 is offset, i.e. does not start immediately after a current zero crossing of type "A" but, for example, 5 to 10 milliseconds later, it is knowingly accepted that one of the parallel switching paths 4, 5, 6 carries out an extinguishing attempt at a possible opening shortly before a current zero crossing 32 of type "B". Since, however, a lower switching power capacity is required to switch this small half wave 17 off, this remaining parallel switching path 4, 5, 6 can handle this situation alone. If, even, an opening of a plurality of parallel switching paths 4, 5, 6 takes place after a current zero crossing 32 of type "B", the current is again divided, and the dielectric rise is reliably sufficient to switch off the current at the next current zero crossing 31 of type "A".

In all cases, including that last mentioned, it is ensured that the opening window 21, 22, 23, 24 is located sufficiently far from the next current zero crossing 31 of type "A" in time that no critical situation arises. The minimum time separation 25 is preferably at least one quarter of the duration of a period T of the network frequency, therefore being 5 ms at a mains frequency of 50 Hz.

An optimum division of the current over the number of parallel switching paths 4, 5, 6, and thus an ability to calculate the dimensioning and the necessary extinguishing capacity of the individual switching paths 4, 5, 6, is then particularly well possible if the synchronization error of the parallel switching paths 4, 5, 6 is as small as possible, i.e. that they open as quickly as possible one after another. In a preferred form of embodiment of the invention, a time separation 26, which corresponds to at most one fifth of the duration of a period T of the network frequency, thus for example 4 ms at a network frequency of 50 Hz, is present from the first opening switching path 4, 5, 6 to the last opening switching path 4, 5, 6. The opening time moments 27, 28, 29 of the switching paths 4, 5, 6 are entered, by way of example, in the opening window 21 in FIG. 3.

Although the invention has been more closely illustrated and described in more detail through the preferred example embodiment, the invention is not restricted to the disclosed examples, and other variations can be derived from this by the expert without leaving the scope of protection of the invention.

The invention claimed is:

1. A method for the operation of an electrical generator switch for medium or high voltage, in which switching device at least two parallel switching paths are allocated to a phase, the method comprising:

detecting current zero crossings in the phase;
allocating all of the at least two parallel switching paths to the phase, to open within an opening window of time correlated to the current zero crossings detected in the phase; and
actuating at least one switching mechanism of the electrical generator switch for medium or high voltage, operatively connected to the at least two parallel switching paths allocated to open within the opening window of time.

2. The method of claim 1, wherein the window of time starts after one of the current zero crossings is detected in the phase, and ends before a next of the current zero crossings is detected.

3. The method of claim 1, wherein the window of time starts after one of the detected current zero crossings in the phase and ends before a next of the detected current zero crossing of a same polarity.

4. The method of claim 1, wherein the window of time starts after one of the detected current zero crossings of a large half wave in the phase and ends before a next of the detected current zero crossings of the large half wave.

5. The method of claim 1, wherein the window of time follows one of the detected current zero crossings in the phase immediately.

6. The method of claim 1, wherein the minimum time separation of the window of time and a next of the detected current zero crossings corresponds to at least one quarter of a duration of a period of a network frequency.

7. The method of claim 1, wherein the time separation between the opening of the first of the parallel switching paths to open and the opening of the last of the parallel switching paths to open corresponds to at most one fifth of a duration of a period of a network frequency.

8. An electric generator switch for medium or high voltage including at least two parallel switching paths allocated to a phase, the electrical switching device comprising:

means for detecting current zero crossings in the phase;
means for allocating all of the at least two parallel switching paths to the phase, to open within an opening window of time correlated to the detected current zero crossings in the phase; and
means for actuating at least one switching mechanism of the electric generator switch for medium or high voltage, operatively connected to the at least two parallel switching paths, allocated to open within the opening window of time.

9. The electric switching device of claim 8, wherein the electric switching device is designed for a multi-phase network.

10. The method of claim 2, wherein the window of time starts after one of the detected current zero crossings in the phase and ends before a next of the detected current zero crossing of a same polarity.

11. The method of claim 2, wherein the window of time starts after one of the detected current zero crossings of a large half wave in the phase and ends before a next of the detected current zero crossings of the large half wave.

12. The method of claim 3, wherein the window of time starts after one of the detected current zero crossings of a large half wave in the phase and ends before a next of the detected current zero crossings of the large half wave.

13. The method of claim 2, wherein the window of time follows one of the detected current zero crossings in the phase immediately.

14. The method of claim 3, wherein the window of time follows one of the detected current zero crossings in the phase immediately.

15. The method of claim 4, wherein the window of time follows one of the detected current zero crossings in the phase immediately.

16. The method of claim 2, wherein the minimum time separation of the window of time and a next of the detected current zero crossings corresponds to at least one quarter of a duration of a period of a network frequency.

17. The method of claim 2, wherein the time separation between the opening of the first of the parallel switching paths to open and the opening of the last of the parallel switching paths to open corresponds to at most one fifth of a duration of a period of a network frequency.

18. An electrical generator switch for medium or high voltage, wherein at least two parallel switching paths are allocated to a phase, the electrical switching device comprising:
 a detector to detect current zero crossings in the phase;
 at least one processor configured to allocate all of the at least two parallel switching paths to the phase, to open within an opening window of time correlated to the current zero crossings detected in the phase; and
 an actuator to actuate at least one switching mechanism of the electrical generator switch for medium or high voltage, operatively connected to the at least two parallel switching paths allocated to open within the opening window of time.

19. The electrical generator switch of claim 18, wherein the electrical generator switch is designed for a multi-phase network.

20. The electric generator switch of claim 8, wherein the window of time starts after one of the current zero crossings is detected in the phase, and ends before a next of the current zero crossings is detected.

21. The electric generator switch of claim 9, wherein the window of time starts after one of the current zero crossings is detected in the phase, and ends before a next of the current zero crossings is detected.

22. The electrical generator switch of claim 18, wherein the window of time starts after one of the current zero crossings is detected in the phase, and ends before a next of the current zero crossings is detected.

23. The electrical generator switch device of claim 19, wherein the window of time starts after one of the current zero crossings is detected in the phase, and ends before a next of the current zero crossings is detected.

* * * * *